United States Patent [19]
Stolmeijer et al.

[11] Patent Number: 5,742,090
[45] Date of Patent: Apr. 21, 1998

[54] NARROW WIDTH TRENCHES FOR FIELD ISOLATION IN INTEGRATED CIRCUITS

[75] Inventors: André Stolmeijer, Santa Clara; Farrokh Omid-Zohoor, Sunnyvale, both of Calif.

[73] Assignee: Advanced Micro Devices, Inc., Sunnyvale, Calif.

[21] Appl. No.: 625,814

[22] Filed: Apr. 4, 1996

[51] Int. Cl.$^6$ .................... H01L 29/00; H01L 29/76; H01L 29/94
[52] U.S. Cl. .................... 257/510; 257/371; 257/372
[58] Field of Search .................... 257/371, 372, 257/510, 511, 513, 519

[56] References Cited

U.S. PATENT DOCUMENTS

| | | | |
|---|---|---|---|
| 4,211,582 | 7/1980 | Horng et al. | 257/519 |
| 4,905,065 | 2/1990 | Selcuk et al. | 357/23.6 |
| 4,922,318 | 5/1990 | Thomas et al. | 357/43 |
| 5,445,989 | 8/1995 | Lur et al. | 437/67 |
| 5,445,990 | 8/1995 | Yook et al. | 437/69 |
| 5,457,339 | 10/1995 | Komori et al. | 257/510 |
| 5,459,096 | 10/1995 | Venkatesan et al. | 437/67 |
| 5,460,998 | 10/1995 | Liu | 437/57 |
| 5,466,623 | 11/1995 | Shimize et al. | 437/52 |
| 5,468,675 | 11/1995 | Kaigawa | 437/69 |
| 5,468,676 | 11/1995 | Madan | 437/70 |
| 5,470,783 | 11/1995 | Chiu et al. | 437/72 |
| 5,472,904 | 12/1995 | Figura et al. | 437/67 |
| 5,472,905 | 12/1995 | Paek et al. | 437/70 |
| 5,472,906 | 12/1995 | Shimizu et al. | 437/72 |
| 5,473,186 | 12/1995 | Morita | 257/519 |
| 5,474,953 | 12/1995 | Shimizu et al. | 437/67 |

OTHER PUBLICATIONS

Dennehy, William J., "Non–Lutching Integrated Circuits", RCA Technical Notes No. 876, 12 Feb. 1971 (4 pp.).

Fuse, Genshu; Fukumoto, Masanori; Shinohara, Akihira; Odanaka, Shinji; Sasago, Masaru and Ohzone, Takashi, "A New Isolation Method with Boron–Implanted Sidewalls for Controlling Narrow–Width Effect" IEEE Transactions On Electron Devices, vol. ED–34, No. 2, Feb., 1987.

Sawada, Shizuo; Higuchi, Takayoshi; Mizuno, Tomohisa; Shinozaki, Satoshi and Ozawa, Osamu, "Electrical Properties for MOS LSI's Fabricated Using Stacked Oxide SWAMI Technology" IEEE Transactions on Electron Devices, vol. ED–32, No. 11, Nov. 1985.

Wolf Ph.D., Stanley, Chapter 6.6.7 "Trench Isolation for CMOS", Silicon Processing for the VLSI Era—vol. 3: The Submicron Mosfet, pp. 406–413, 1995.

Wolf Ph.D., Stanley, Chapter 2 "Isolation Technologies for Integrated Circuits", Silicon Processing for the VLSI Era—vol. 2: Process Integration, pp. 12–69, 1990.

Primary Examiner—Wael Fahmy
Assistant Examiner—Howard Weiss
Attorney, Agent, or Firm—Foley & Lardner

[57] ABSTRACT

An integrated circuit device has a plurality of active devices which are formed on a semiconductor body. A plurality of narrow isolating regions of insulating material are vertically formed on the semiconductor body such that at least one of the narrow isolating regions separates and thereby isolates adjacent active devices. Essentially all of said isolating regions are substantially equal in width, preferably less than or equal to about 0.5 μm.

15 Claims, 10 Drawing Sheets

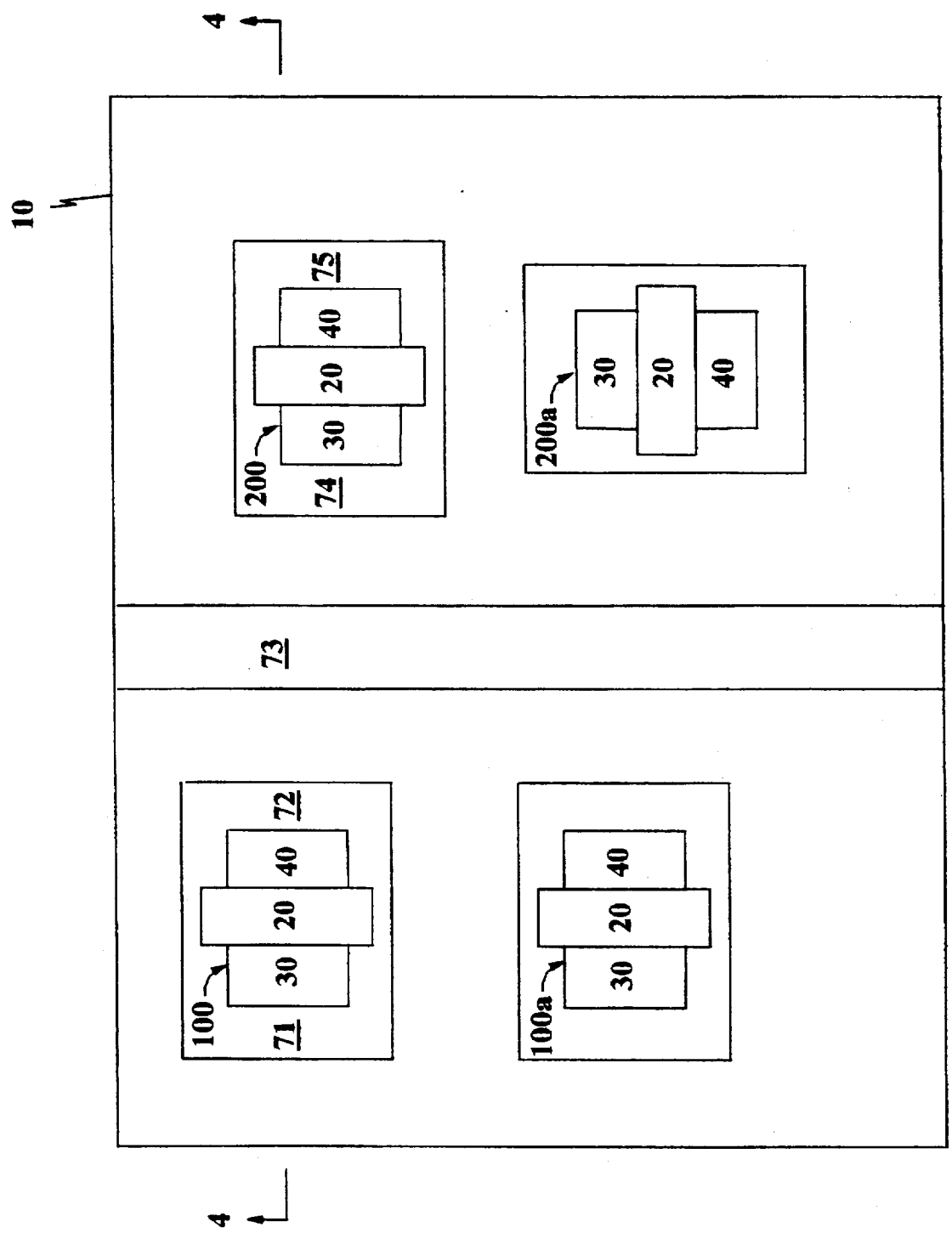

NARROW WIDTH TRENCHES FOR FIELD ISOLATION IN INTEGRATED CIRCUITS

BACKGROUND OF THE INVENTION

1. Field of the Invention

The invention relates generally to an integrated circuit (IC) isolation structure and more particularly to limited width trench isolation structures which are used to isolate devices of an IC.

2. Description of the Related Art

Various isolation structures are available to isolate devices in integrated circuits. One isolation structure, developed using a conventional method known as trench etch and refill, is shown in FIG. 1. In the conventional method, trenches 61–63 are etched in respective field regions 120 and 220 of the active devices 100 and 200 and subsequently filled with a CVD oxide 50 to isolate the active devices 100 and 200.

One problem with the conventional method is that a phenomena known in the art as "dishing" occurs in the oxide regions above the trenches 61–63 during the formation of the isolation structure. The "dishing" of the oxide 50 is represented by non-planar surface of the oxide 50 in FIG. 1.

The conventional method is illustrated in further detail by FIGS. 2A–2F. A pad oxide layer 11 is thermally grown on the surface of a silicon substrate 10 having well regions 130 and 230 as shown in FIG. 2A. Next, a layer of CVD silicon nitride 12 is deposited on top of the pad oxide layer 11 as shown in FIG. 2B. A photo-resist mask layer (not shown) is then deposited on top of the nitride layer 12 and the region of the nitride layer 12 exposed through the mask layer is anisotropically dry etched to produce etched openings 14 through the nitride layer 12 (see FIG. 2C). The etched openings 14 define field regions which are subsequently etched to form isolation trenches 61–63 illustrated in FIG. 2D (also shown in FIG. 1). The remaining portions of the nitride layer 12 function as a mask during the etching step.

After the trench formation, a CVD oxide layer 50 of a thickness H, where H>thickness of the nitride layer 12+thickness of the pad oxide layer 11+the height of the trench 62, is deposited above the remaining portions of the nitride layer 12 and the trenches 61–63. Basically, the main criteria is to make sure that the level of the CVD oxide layer 50 is above the level of the nitride layer 12.

The step of depositing the CVD oxide layer 50 is followed by a planarization technique. One technique may be direct polishing. The resulting structure after the step of polishing is illustrated in FIG. 2F which shows that the level of the oxide 50 at the center portions of the trenches 61–63 are lower in height than at the edge portions of the trenches 61–63. This phenomena is what is known in the art as "dishing" and, as shown in FIG. 2F, adversely affects the planarity of the IC.

An alternative conventional method is illustrated in FIGS. 3A–3H. Steps associated with FIGS. 3A–3E are identical to the steps described with respect to FIGS. 2A–2E and will not be repeated here. Planarization in the alternative conventional method is carried out by the use of a planarization mask 51 as shown in FIG. 3F. After the planarization mask 51 is applied, the CVD oxide layer 50 is etched and the planarization mask 51 is removed. The resulting structure is illustrated in FIG. 3G. The structure of FIG. 3G is then polished to yield the structure of FIG. 3H, which again shows the effect of "dishing."

SUMMARY OF THE INVENTION

An object of the invention is to provide an IC isolation structure which uses limited width trenches in the field regions to minimize the "dishing" effect.

Another object of the invention is to provide an IC isolation structure which reduces latch-up susceptibility.

Still another object of the invention is to provide a method of forming an IC isolation structure without the use of a planarization mask.

The above and other objects of the invention are accomplished by an integrated circuit device having a plurality of active devices which are formed on a semiconductor body and a plurality of narrow isolating regions of insulating material vertically formed on the semiconductor body. At least one of the narrow isolating regions separates and thereby isolates adjacent active devices. Essentially all of the isolating regions are substantially equal in width, preferably less than or equal to about 0.5 μm.

The active devices of the integrated circuit may be CMOS devices and comprise N-type and P-type transistors, in which case at least three of the isolating regions separate the N-type and P-type transistors of each CMOS device. One of the three isolating regions are disposed between and separated from the other two by an impurity type of the same type as the impurity of the semiconductor body of the particular N-type and P-type transistors, thereby providing junction as well as insulating isolation.

Additional objects and advantages of the invention will be set forth in the description which follows. The objects and advantages of the invention may be realized and obtained by means of the instrumentalities and combinations particularly pointed out in the appended claims.

BRIEF DESCRIPTION OF THE DRAWINGS

The invention is described in detail herein with reference to the drawings in which:

FIG. 4 is a top view of a wafer including the isolation structure according to the invention.

DETAILED DESCRIPTION OF THE PREFERRED EMBODIMENT

Figure 1:
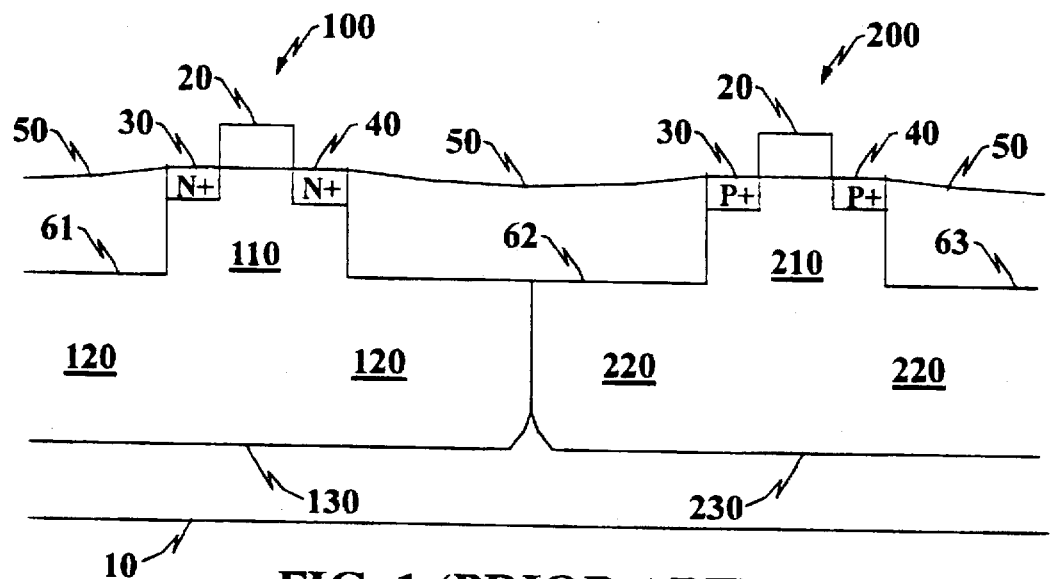
FIG. 1 illustrates an isolation structure of a conventional IC.

FIG. 4 is a top view of a portion of a silicon wafer or substrate 10. Active devices 100 and 200, together with active devices 100a and 200a are formed on the silicon wafer or substrate 10. These active devices represent transistors having a polysilicon gate 20, a source region 30, and a drain region 40. The active devices 200 and 200a are both p-channel metal oxide semiconductor (PMOS) transistors and the active devices 100 and 100a are both n-channel metal oxide semiconductor (NMOS) transistors. Each active device has an isolation structure (a trench filled with oxide) surrounding it. There is provided an additional trench 73 (also filled with oxide) extending across the portion of the wafer 10 shown. The trench 73 filled with oxide isolates the PMOS transistors from the NMOS transistors.

Figure 5:
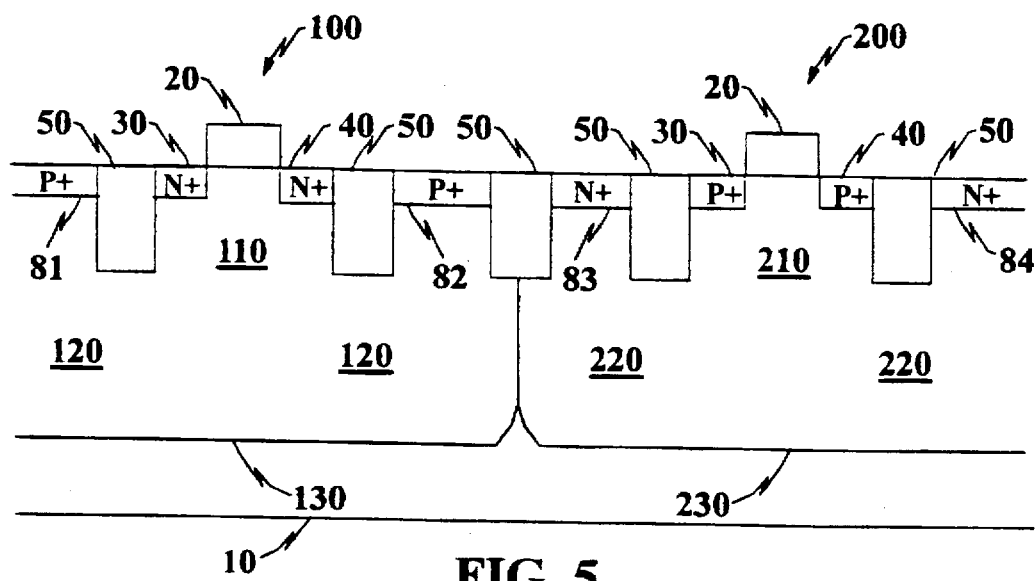
FIG. 5 illustrates a first type of IC in which the isolation structure according to the invention is implemented.

FIG. 5 illustrates a complimentary metal oxide semiconductor (CMOS), taken along line 4—4 of FIG. 4, having a substrate 10, and active devices 100 and 200. The active device 100 is formed in a p-well region 130 and the active device 200 is formed in an n-well region 230. Each active device has associated therewith a gate 20, a source region 30, and a drain region 40. Further, an active region 110 and a field region 120 is defined with respect to the active device 100 and an active region 210 and a field region 220 is defined with respect to the active device 200.

The isolation structure includes a plurality of limited width trenches 71-75, each of which is filled with a CVD oxide 50. Unlike the isolation structure of the conventional IC, the isolation structure according to the invention shown in FIG. 5 has isolation trenches 71-75 whose widths are not a function of the corresponding field region. Instead, the widths of the isolation trenches 71-75 are of a predetermined size, preferably less than or equal to about 0.5 µm. In the exemplary embodiment shown in FIG. 5, the trench widths are each equal to 0.5 µm.

FIG. 5 also illustrates a plurality of high dopant regions 81-84. The field region 120 of the p-well region 130 is implanted with p+ impurities (e.g., B, $BF_2$, $BCl_2$, or any combination thereof) and the field region 220 of the n-well region 230 is implanted with n+ impurities (e.g., P, Sb, or any combination thereof). The high dopant regions 81-84 suppresses a phenomena known in the art as latch-up.

Figure 2A:
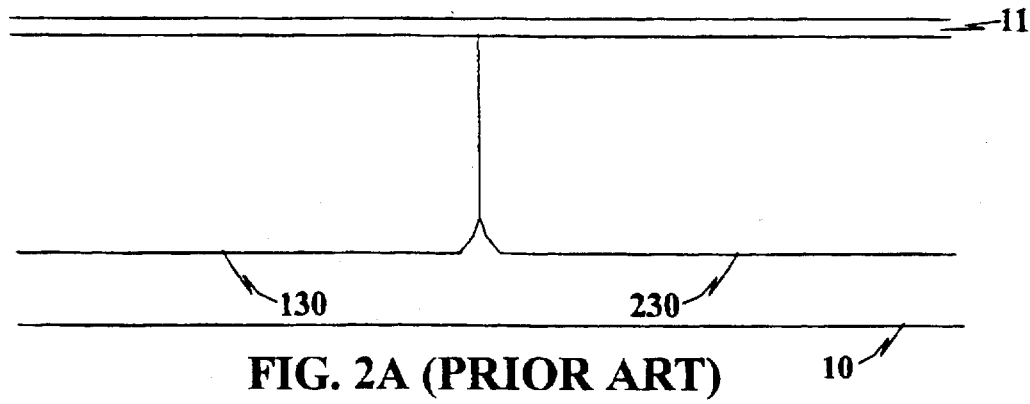
FIGS. 2A–2F illustrate how "dishing" occurs in the conventional method.
Figure 2B:
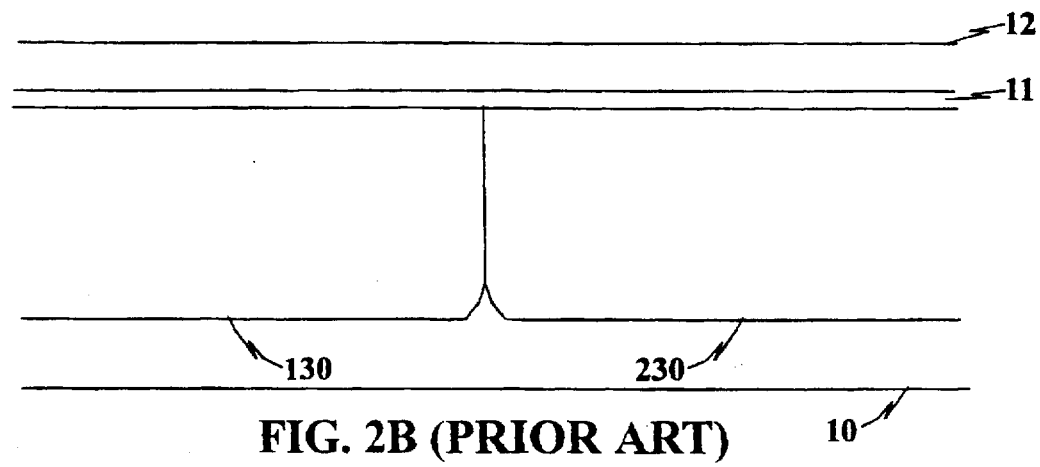
Figure 2C:
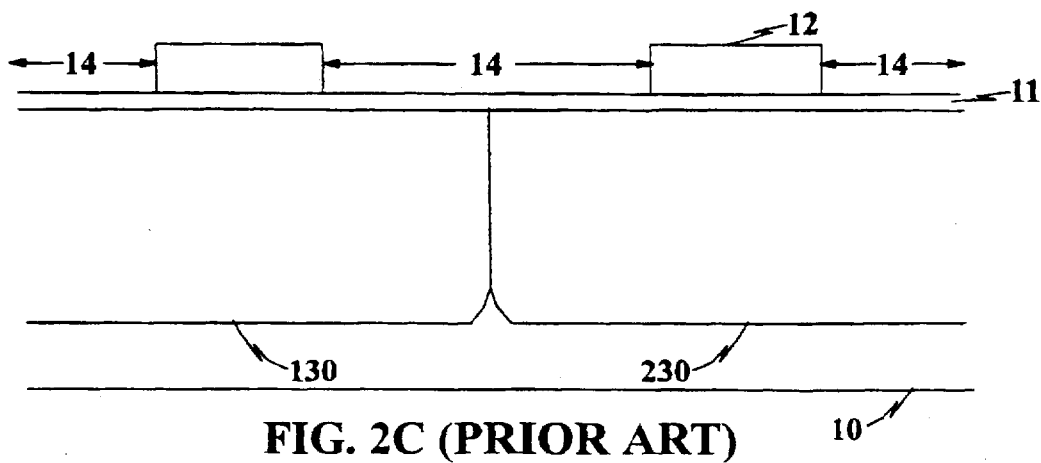
Figure 2D:
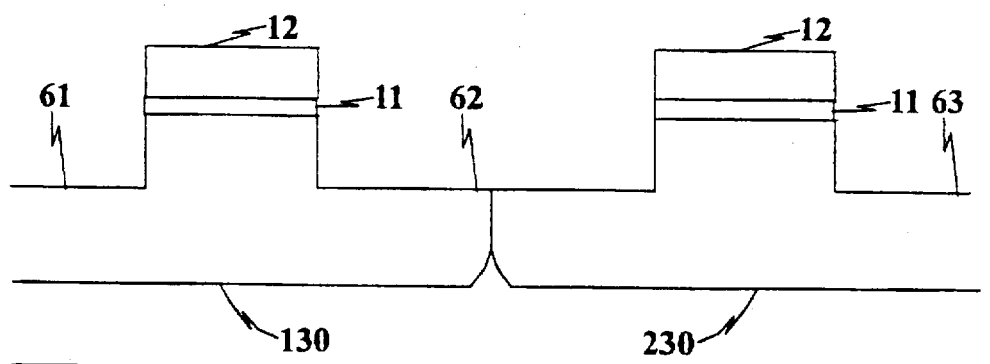
Figure 2E:
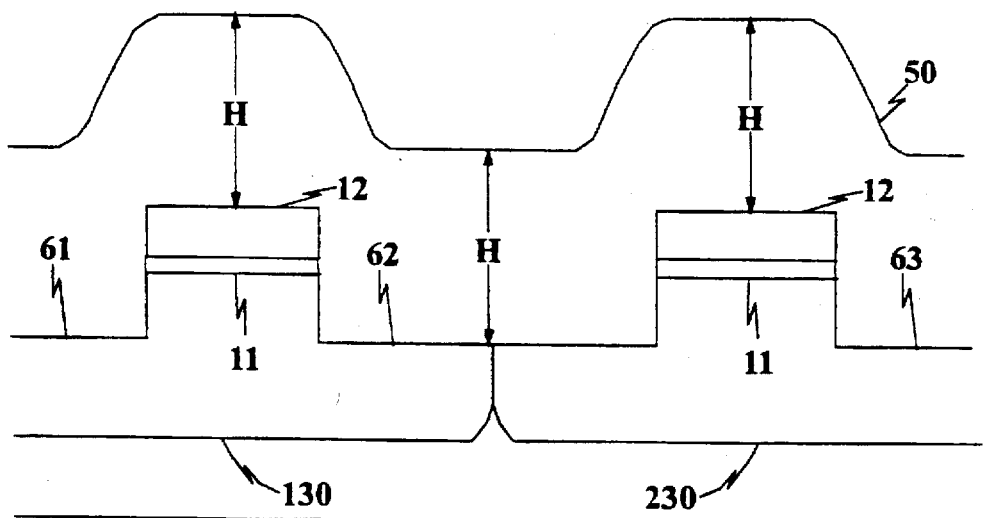
Figure 2F:
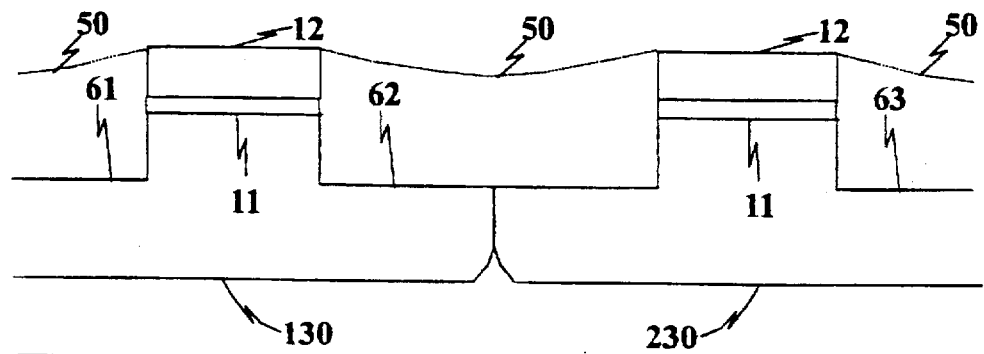
Figure 3A:
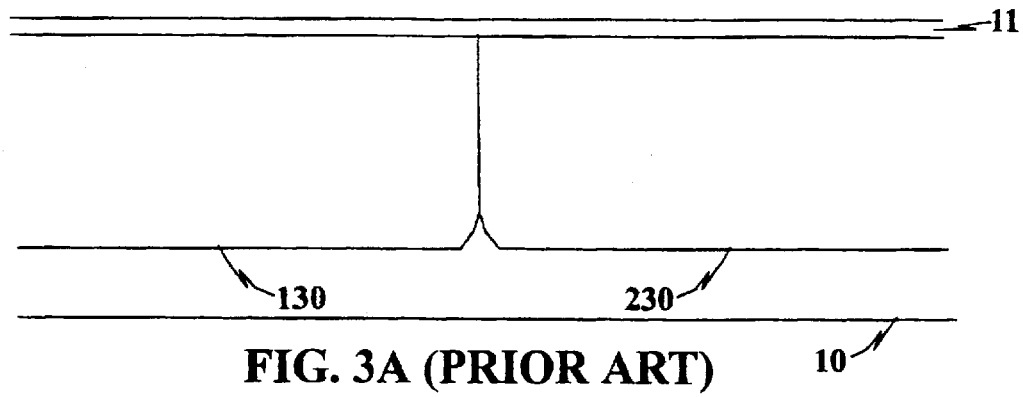
FIGS. 3A–3H illustrate the conventional method using a planarization mask.
Figure 3B:
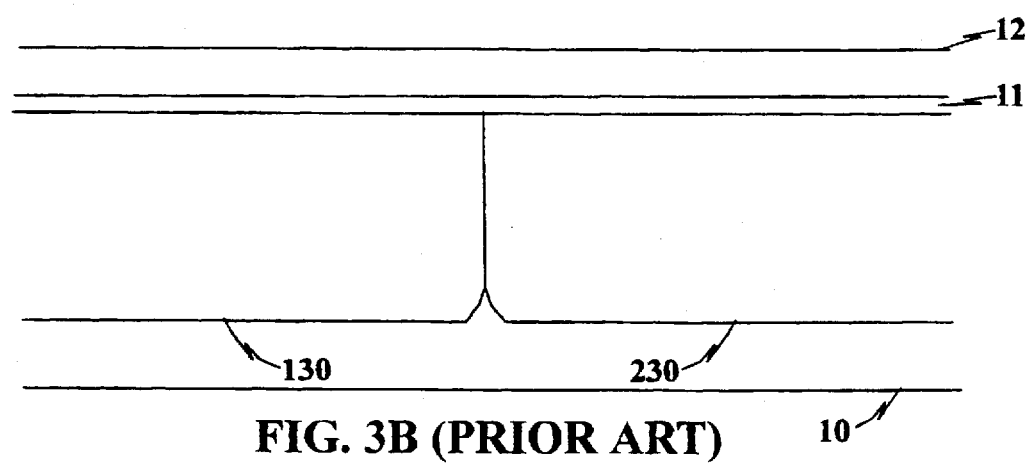
Figure 3C:
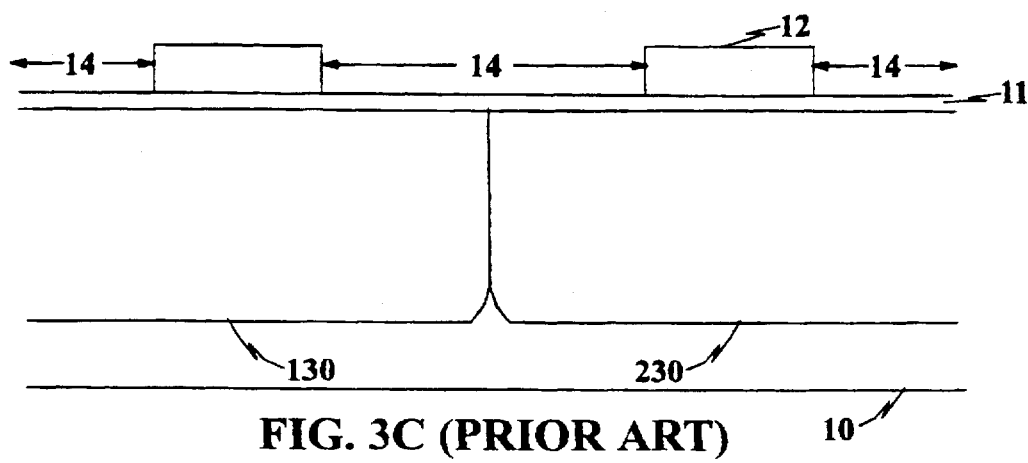
Figure 3D:
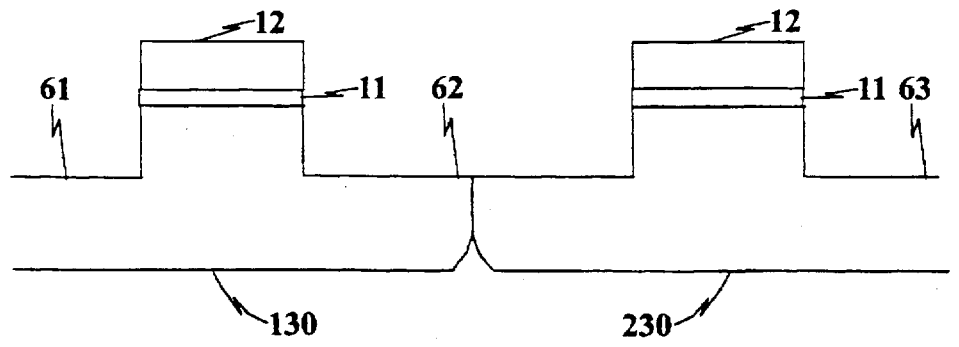
Figure 3E:
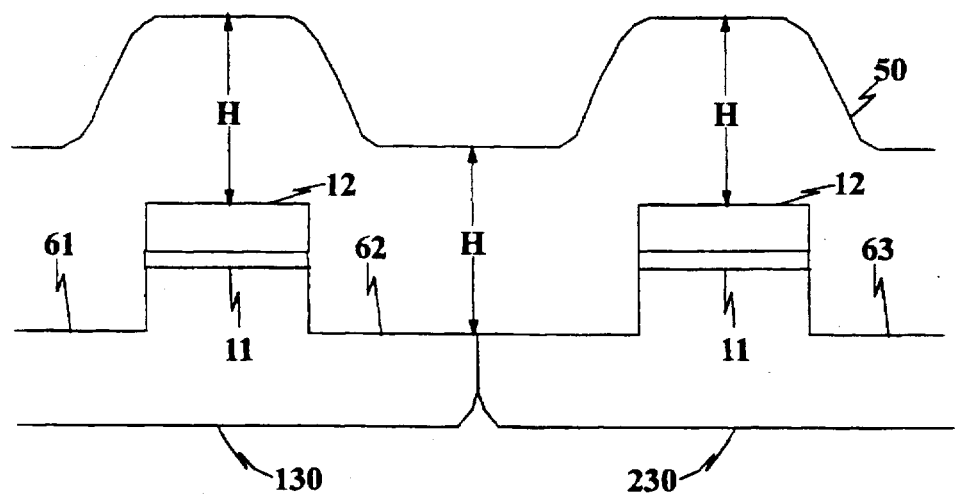
Figure 3F:
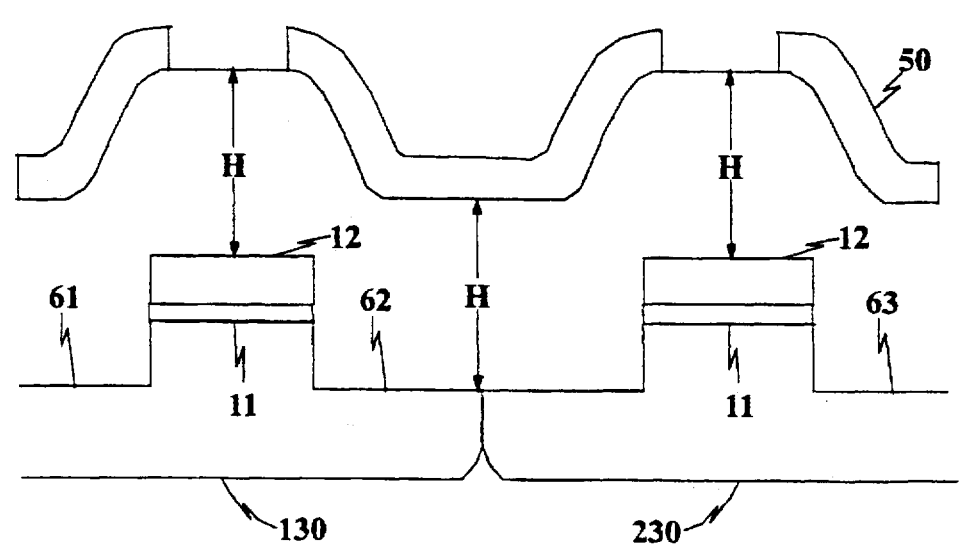
Figure 3G:
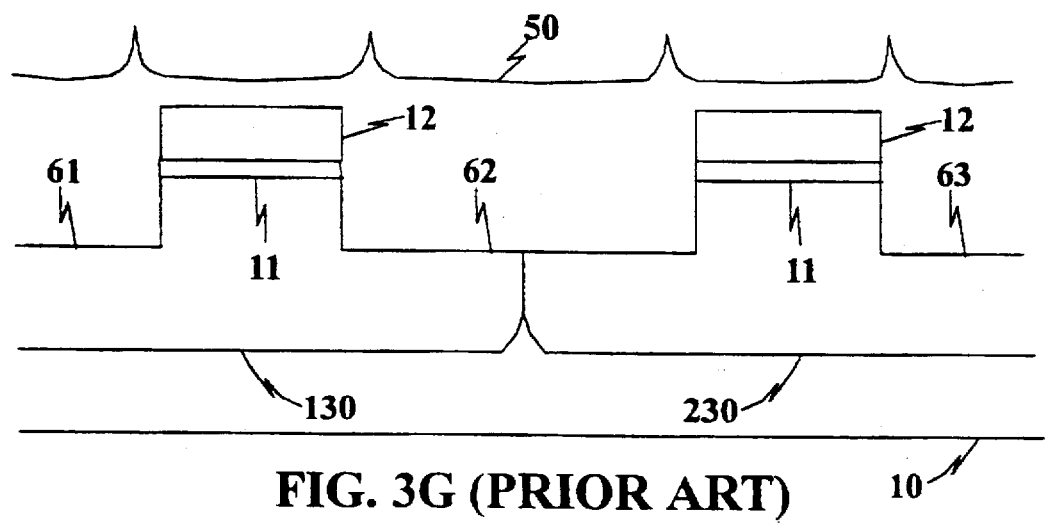
Figure 3H:
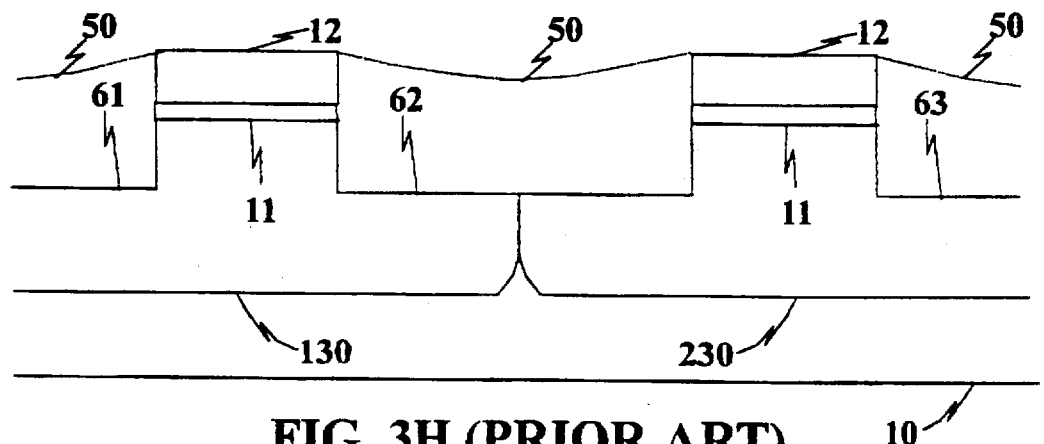
Figure 6A:
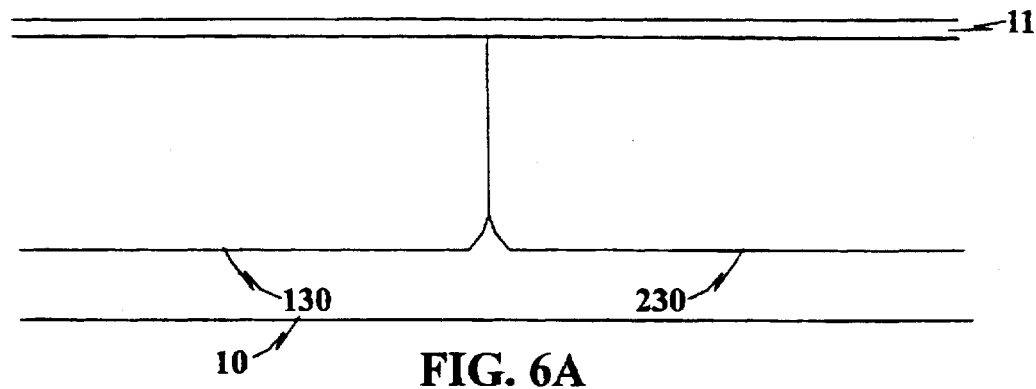
FIGS. 6A–6F illustrate the method of preparing the isolation structure according to the invention.
Figure 6B:
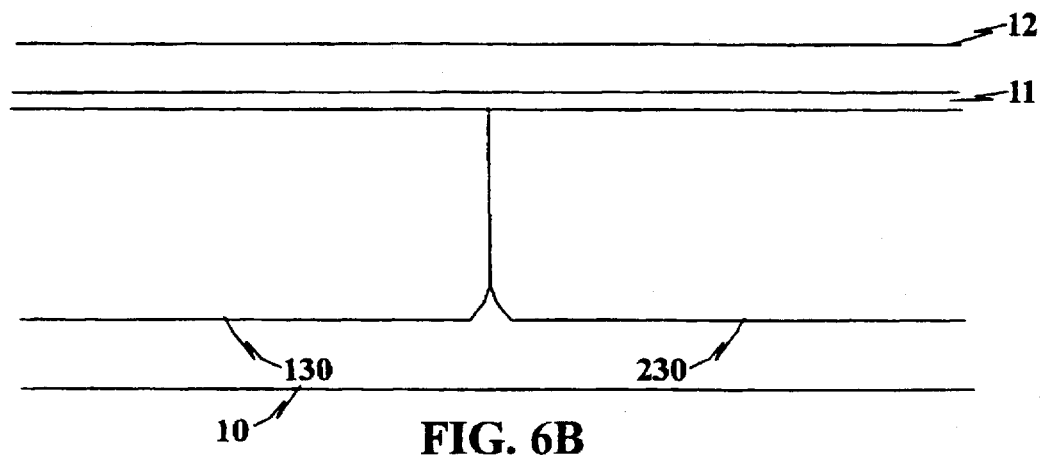
Figure 6C:
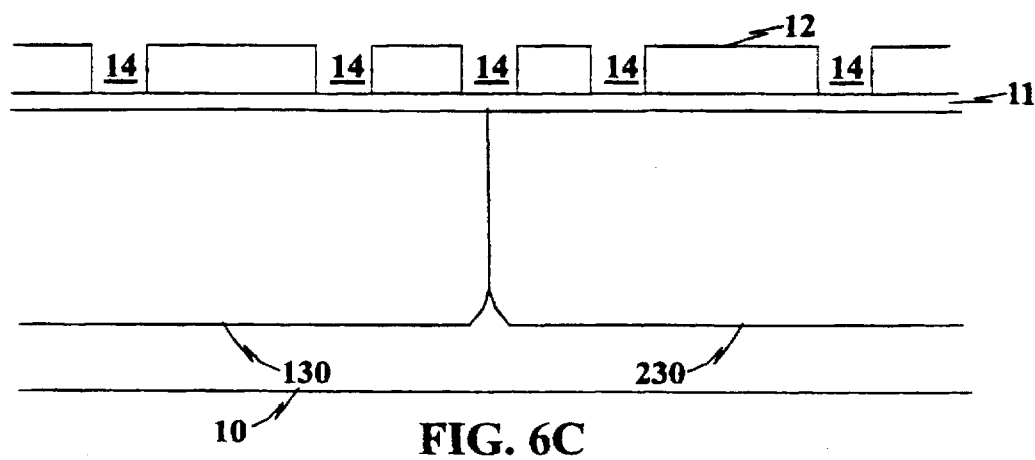
Figure 6D:
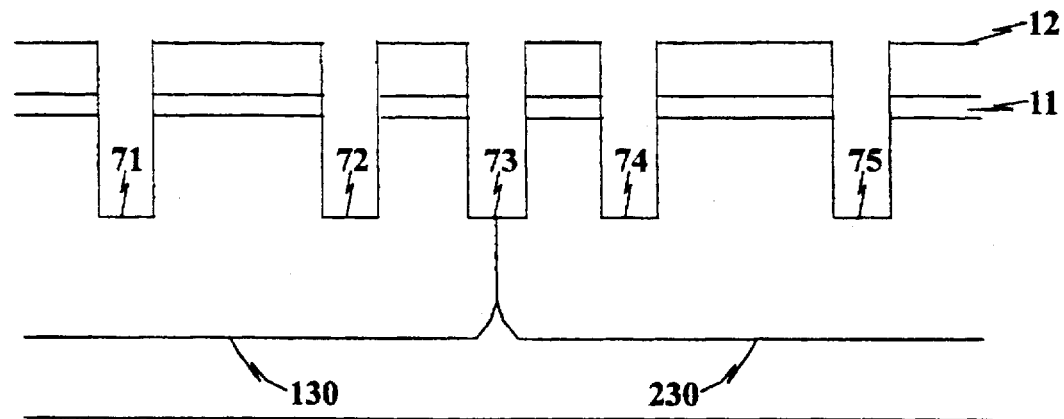

FIGS. 6A-6F illustrate the steps of preparing the isolation structure according to the invention. A pad oxide layer 11 is thermally grown on the surface of a silicon substrate 10 having well regions 130 and 230 as shown in FIG. 6A. Next, a layer of CVD silicon nitride 12 is deposited on top of the pad oxide layer 11 as shown in FIG. 6B. A photo-resist mask layer (not shown) is then deposited on top of the nitride layer 12 and the region of the nitride layer 12 exposed through the mask layer is anisotropically dry etched to produce etched openings 14 (all of equal limited width) through the nitride layer 12 (see FIG. 6C). The etched openings 14 define regions which are subsequently etched to form isolation trenches 71-75 illustrated in FIG. 2D. Unlike the conventional method, the etched openings 14 are not as wide as the field regions 120 and 220 (see FIG. 5) of the active devices 100 and 200. Instead, the etched openings 14 are controlled to be preferably less than or equal to about 0.5 µm.

Figure 6E:
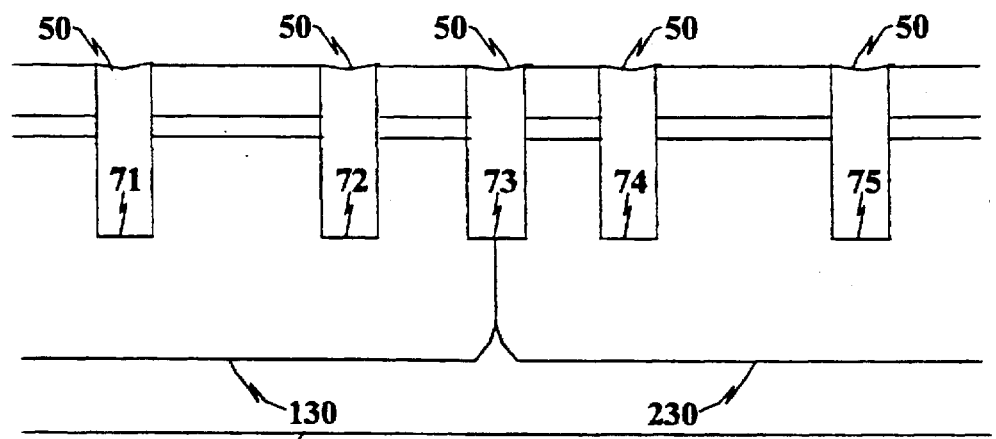

After the trench formation, an oxide layer is deposited above the remaining portions of the nitride layer 12 and the trenches 71-75, and is polished until the entire upper surface of the remaining portions of the nitride layer 12 is exposed. The resulting structure after the step of polishing is illustrated in FIG. 6E which shows that, because of the limited width of the trenches 71-75, the level of the oxide at the center portions of the trenches 71-75 are substantially the same as the level of the oxide at the edge portions of the trenches 71-75. In other words, "dishing" is no longer a problem in the method according to the invention.

Figure 6F:
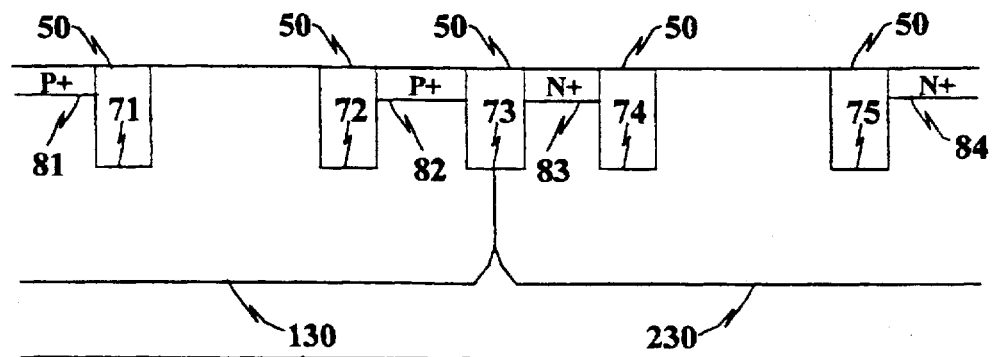

Subsequent to the polishing step, the remaining portions of the nitride layer 12 are removed using a phosphoric acid etch. Optionally thereafter, a mask layer is applied and field regions are implanted with dopants, once in the p-field regions with p+ dopants (e.g., B, $BF_2$, $BCl_2$, or any combination thereof) and once in the n-field regions with n+ dopants (e.g., P, Sb, or any combination thereof). The resulting structure is illustrated in FIG. 6F. The presence of these doped field regions 81-84 suppresses the latch-up phenomena. The subsequent steps to arrive at the structure of FIG. 5 are well known in the art and are omitted herein.

Figure 7:
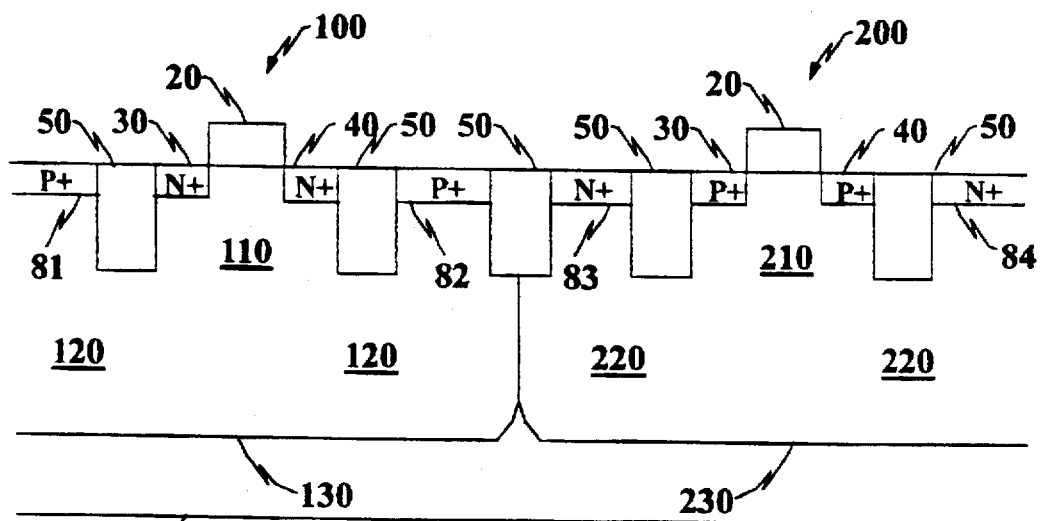
FIG. 7 illustrates a second type of IC in which the isolation structure according to the invention is implemented.

FIG. 7 illustrates the isolation structure according to the invention implemented in NMOS device. In FIG. 7, a plurality of limited width trenches 71-77, whose widths are preferably less than or equal to about 0.5 µm and which are filled with a CVD oxide 50, function as isolation regions for active devices 300, 400, 500 and 600. As discussed with the CMOS of FIG. 4, "dishing" is not a problem with the structure illustrated in FIG. 7, because of the limited width of the trenches 71-77.

Figure 8:
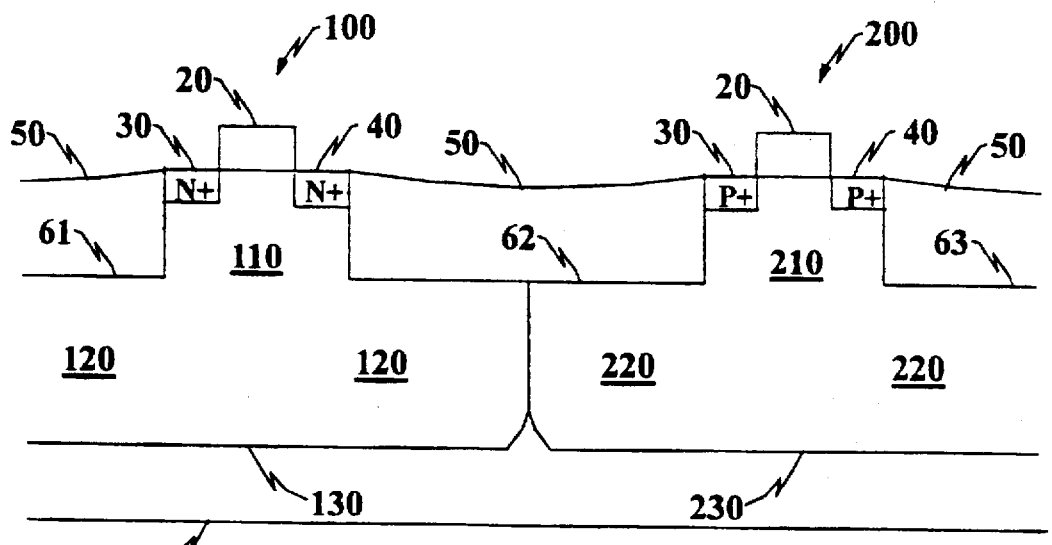
FIG. 8 illustrates the isolation structure of another conventional IC.

By comparison, the prior art NMOS device of FIG. 8, which also shows active devices 300, 400, 500 and 600, shows a non-planar surface of the oxide 50. The non-planar surface is due to the "dishing" effect which, as described with respect to FIG. 1, occurs when widths of trenches 61, 63, 64 and 65 are not limited as taught by the present invention, but instead, are determined by the widths of the respective field regions between the active devices 300, 400, 500 and 600.

While particular embodiments according to the invention have been illustrated and described above, it will be clear that the invention can take a variety of forms and embodiments within the scope of the appended claims.

We claim:

1. A field effect transistor (FET) integrated circuit device comprising:

a semiconductor body of a certain impurity type and with a top surface, said body having at least a pair of FET transistors with each having a source and drain disposed in the body and each having a gate disposed on the top surface;

at least two spaced apart, narrow, substantially equally wide isolating regions of insulating material in the body and extending from the top surface into the body and separating said pair of transistors; and a region in said body with an impurity the same type as in the body but of a greater concentration and extending from the top surface between the isolating regions.

2. The integrated circuit device of claim 1 wherein the pair of FET transistors are the same type.

3. The integrated circuit device of claim 1 wherein the pair of FET transistors are complementary and one is a N-type and the other is a P-type and are separated by at least three isolating regions comprising two outer isolating regions and an inter isolating region with an impurity region between each of the outer regions and the inter region of a concentration greater than said body, the N-type transistor being adjacent one of the outer isolating regions and its associated impurity region being P-type and the P-type transistor being adjacent the other outer isolating region and its associated impurity region being N-type.

4. The integrated circuit device of claim 2 wherein the source and drain of the P-type transistor is disposed in a N well in the semiconductor body.

5. The integrated circuit device of claim 3 wherein the source and drain of the N-type transistor is disposed in a P well in the semiconductor body.

6. The integrated circuit device of claim 5 wherein the inner isolating region separates the N and P wells.

7. The integrated circuit device of claim 1 wherein the width of each of said isolating regions is less than or equal to about 0.5 µm.

8. A field effect transistor (FET) integrated circuit device comprising:

a semiconductor body of a certain impurity type and with a top surface, said body having a plurality of FET transistors with each having a source and drain disposed in the body and each having a gate disposed on the top surface;

at least two spaced apart, narrow, substantially equally wide isolating regions of insulating material in the body for each adjacent pair of transistors of the plurality of transistors and extending from the top surface into the body and separating said adjacent transistors; and a region in said body with an impurity the same type as in the body but of a greater concentration and extending from the top surface into the body and positioned between the isolating regions.

9. The integrated circuit device of claim 8 wherein at least a pair of the plurality of FET transistors are the same type.

10. The integrated circuit device of claim 8 wherein at least a pair of FET transistors are complementary and one is a N-type and the other is a P-type and are separated by at least three isolating regions comprising two outer isolating regions and an inter isolating region with an impurity region between each of the outer regions and the inter region of a concentration greater than said body, the N-type transistor being adjacent one of the outer isolating regions and its associated impurity region being P-type and the P-type transistor being adjacent the other outer isolating region and its associated impurity region being N-type.

11. The integrated circuit device of claim 10 wherein all of the FET transistors are complementary.

12. The integrated circuit device of claim 10 wherein the source and drain of the P-type transistor is disposed in a N well in the semiconductor body.

13. The integrated circuit device of claim 11 wherein the source and drain of the N-type transistor is disposed in a P well in the semiconductor body.

14. The integrated circuit device of claim 13 wherein the inner isolating region separates the N and P wells.

15. The integrated circuit device of claim 1 wherein the width of each of said isolating regions is less than or equal to about 0.5 µm.

* * * * *